(12) United States Patent
Naigertsik et al.

(10) Patent No.: US 11,284,540 B2
(45) Date of Patent: Mar. 22, 2022

(54) THERMAL MANAGEMENT OF PRINTED CIRCUIT BOARD COMPONENTS

(71) Applicant: Elbit Systems Ltd., Haifa (IL)

(72) Inventors: Oleg Naigertsik, Haifa (IL); Alex Fischman, Tal-El (IL); Ian Engleman, Yoqneam Illit (IL); Isaac Jak Kettner, Haifa (IL)

(73) Assignee: Elbit Systems Ltd., Haifa (IL)

( * ) Notice: Subject to any disclaimer, the term of this patent is extended or adjusted under 35 U.S.C. 154(b) by 0 days.

(21) Appl. No.: 16/589,503

(22) Filed: Oct. 1, 2019

(65) Prior Publication Data

US 2020/0245502 A1 Jul. 30, 2020

Related U.S. Application Data

(63) Continuation of application No. 15/639,788, filed on Jun. 30, 2017, now abandoned, which is a
(Continued)

(30) Foreign Application Priority Data

Dec. 31, 2014 (IL) .......................................... 236544

(51) Int. Cl.
*H05K 7/20* (2006.01)
*D03D 25/00* (2006.01)
*D03D 11/00* (2006.01)
(Continued)

(52) U.S. Cl.
CPC ....... *H05K 7/20563* (2013.01); *D03D 1/0082* (2013.01); *D03D 11/00* (2013.01); *D03D 15/267* (2021.01); *D03D 25/005* (2013.01); *H05K 1/0271* (2013.01); *H05K 1/0366* (2013.01); *H05K 1/09* (2013.01); *H05K 1/115* (2013.01); *H05K 3/0011* (2013.01); *H05K 3/42* (2013.01);
(Continued)

(58) Field of Classification Search
CPC .................................................. H05K 7/20563
USPC ....................................................... 361/690
See application file for complete search history.

(56) References Cited

U.S. PATENT DOCUMENTS 5,202,816 A * 4/1993 DeWilde ............ H05K 7/20572
165/80.3
6,330,153 B1 * 12/2001 Ketonen ............ H05K 7/20145
165/104.33
(Continued)

*Primary Examiner* — Stanley Tso
(74) *Attorney, Agent, or Firm* — Paul D. Bianco; Gary S. Winer; Fleit Intellectual Property Law

(57) ABSTRACT

A first thermal management approach involves an air flow through cooling mechanism with multiple airflow channels for dissipating heat generated in a PCA. The air flow direction through at least one of the channels is different from the air flow direction through at least another of the channels. Alternatively or additionally, the airflow inlet of at least one channel is off-axis with respect to the airflow outlet. A second thermal management approach involves the fabrication of a PCB with enhanced durability by mitigating via cracking or PTH fatigue. At least one PCB layer is composed of a base material formed from a 3D woven fiberglass fabric, and conductive material deposited onto the base material surface. A conductive PTH extends through the base material of multiple PCB layers, where the CTE of the base material along the z-axis direction substantially matches the CTE of the conductive material along the x-axis direction.

11 Claims, 9 Drawing Sheets

Related U.S. Application Data continuation of application No. PCT/IL2015/051093, filed on Nov. 11, 2015.

(51) Int. Cl.

| | |
|---|---|
| *D03D 1/00* | (2006.01) |
| *D03D 15/267* | (2021.01) |
| *H05K 1/02* | (2006.01) |
| *H05K 1/03* | (2006.01) |
| *H05K 1/11* | (2006.01) |
| *H05K 3/42* | (2006.01) |
| *H05K 7/14* | (2006.01) |
| *H05K 1/09* | (2006.01) |
| *H05K 3/00* | (2006.01) |
| *H05K 1/18* | (2006.01) |

(52) U.S. Cl.
CPC ........... *H05K 7/1422* (2013.01); *H05K 7/207* (2013.01); *H05K 7/20163* (2013.01); *D10B 2101/06* (2013.01); *H05K 1/0201* (2013.01); *H05K 1/18* (2013.01); *H05K 3/429* (2013.01); *H05K 2201/029* (2013.01); *H05K 2201/068* (2013.01)

(56) References Cited

U.S. PATENT DOCUMENTS

| | | | |
|---|---|---|---|
| 2005/0172924 A1* | 8/2005 | Simon .............. | F02M 35/10019 123/184.23 |
| 2006/0065510 A1* | 3/2006 | Kiko ...................... | H01H 9/161 200/1 R |
| 2006/0087815 A1* | 4/2006 | Lanni ................. | H05K 7/20136 361/695 |
| 2009/0243431 A1* | 10/2009 | Ohsawa ................ | F04B 43/046 310/317 |
| 2012/0121487 A1* | 5/2012 | Jewell-Larsen .... | H05K 7/20136 423/219 |

* cited by examiner

MEAN FATIGUE LIFE (MTF) FOR DIFFERENT PCB MATERIALS, USING IPC-TR-579 FAILURE MODEL

| Solution | ZCTE ppm | PCB Quality Factor | Cycles to Failure |
|---|---|---|---|
| Standard | 50 | Poor | 51 |
| | | Good | 787 |
| The best | 33 | Poor | 251 |
| | | Good | 7782 |
| 3D fabric reinforced | 17 | Poor | Virtually infinity |
| | | Good | Virtually infinity |

FIG. 7

THERMAL MANAGEMENT OF PRINTED CIRCUIT BOARD COMPONENTS

CROSS-REFERENCE TO RELATED APPLICATIONS

This application is a Continuation of application Ser. No. 15/639,788 filed on Jun. 30, 2017 as a national phase application of PCT International Application No. PCT/IL2015/051093 with an International Filing Date of Nov. 11, 2015, which claims priority from Israel Patent Application No. 236544, filed Dec. 31, 2014.

FIELD OF THE INVENTION

The present invention relates to printed circuit boards (PCBs) and printed circuit assemblies (PCAs) in general, and to the management of thermal issues associated with a PCB or PCA, in particular.

BACKGROUND OF THE INVENTION

Printed circuit boards (PCBs) are used to mechanically support and electrically connect different electronic components using conductive tracks, pads and other features etched from conductive sheets, typically copper. These copper sheets are typically laminated onto a non-conductive substrate. PCBs, also called printed wiring boards (PWBs), can be single sided (with one conductive layer), double sided (two conductive layers), or even multi-layer.

When choosing PCB substrate materials, the mechanical, electrical, chemical, and thermal properties of the material should be taken into consideration. A commonly used resin for commercial applications is FR-4, which is a designation given to a composite material of woven fiberglass cloth with an epoxy resin binder that is flame resistant. Other di-functional and poly-functional epoxies may also be used. The glass transition temperatures of these substrate materials (Tg) typically ranges from 125° C. to 170° C. Polyimide resins with a higher Tg (>200° C.), long-term thermal resistance, and a lower coefficient of thermal expansion (CTE) are used for high-performance multilayer PCBs with a large number of layers.

In the recent past, heat loads on printed circuit assemblies (PCAs) have increased significantly, in some cases rising from approximately 30 W to 130 W. Standard VME (Versa Module Europa) conduction cooling designs (such as VITA 46/48.2) struggle to provide adequate heat dissipation for such a power level, and are strongly dependent on the amount of ECS (Environmental Control System) cooling available. Most of the VME modules consist of a host PCA and one or two mezzanine boards. In the past, most of the heat was concentrated on the host side of the VME module, while nowadays the mezzanine's power dissipation has increased significantly due to their greater functionality. Designers use the mezzanine boards to locate high power central processing units (CPUs) or graphics processing units (GPUs), which can generate high power dissipation of around 50 W. For fan cooling platforms, power limitations are also restricted due to the increase of the components operational temperatures. These factors can cause a reduction in reliability and service life of the boards.

Some cooling solutions for high power PCAs are described in the VITA 48.3 Liquid Cooling standard. However, liquid cooling solutions significantly increase the dimensions of the cooling system since they require additional items (such as: a liquid to air heat exchanger, a pump, a volume compensator, and the like). Other cooling solutions for high power PCBs are described in the VITA 48.5 Air Flow Through Cooling (AFTC) standard. Such an AFTC configuration includes a single airflow channel that extends through an interior cavity of a main chassis unit, as disclosed for example in U.S. Pat. No. 7,995,346 to Biemer et al. As the electronic modules are enclosed within the main chassis unit, the airflow provides cooling of the interior modules without directly exposing the module electronics to direct contact with air, which eliminates the risk of exposure to contaminants in the air.

While such an AFTC configuration suggests a solution to overcome the actual heat power requirements for many PCAs, there remain several limitations which restrict board design, such as the location of high power components, e.g., central processing units (CPUs), graphics processing units (GPUs) and field-programmable gate arrays (FPGAs). Since the VITA 48.5 AFTC is characterized by a single airflow channel with a single inlet and a single outlet, the location of the highest power dissipation is constrained to be located near the inlet area. This restriction can force the designer to add several high power components in the same board, which can result in poor thermal distribution on the board. Furthermore, it can affect the design of the heat exchanger which can cause pressure drop. In order to overcome the heat dissipation, the heat exchanger density has to increase and therefore the pressure drop through the channel increases. The increase in pressure drop induces several limitations on the cooling system, aircraft environmental control system (ECS), or fan cooling.

Conductors on different layers of the PCB are connected with holes in the PCB, which are referred to as "vias". The most common type of via is a "plated through hole" (PTH), which is formed by drilling a hole through the multilayer PCB and electrochemically plating the hole with a conductive metal, usually copper, providing electrical connections between the layers. Vias may be formed in a variety of configurations. A common configuration is the "stub via", in which the though portion extends from the top layer to an inner layer, while the stub portion continues from the inner layer junction to the bottom layer. Alternatively, a first stub extends from the top layer to a first inner signal layer, a through portion continues to a second inner layer, and a second stub continues from the second inner layer to the bottom layer. A "through via" is a basic configuration in which there are no stubs but only a through hole extending between the external layers. A "blind via" originates at an external layer and terminates at some inner layer, while a "buried via" connects one or more internal layers only (without connecting to any external layer). A "back-drilled via" is formed using the post-fabrication back-drilling process to remove the stub portions of a PTH via, used in relatively thick PCBs such as thick high-speed backplane designs.

One well known failure mode associated with PCB reliability is the phenomenon of via cracking and PTH fatigue. Via cracking occurs due to the out-of-plane/z-axis mismatch of the coefficient of thermal expansion (CTE) between the copper plating of a PTH via (approximately 17 ppm/° C.) and the surrounding substrate materials (approximately 45-70 ppm/° C.). This material property mismatch leads to differential expansion during temperature variations and the formation of cracks in the via barrel and inner layers as a result of mechanical fatigue. When exposed to thermal cycling, the initiated via cracks may propagate along the copper plated barrel and gradually expand, leading to degradation and eventual PTH failure. In particular, via cracks continually affect electrical discontinuities in the PCB, which can ultimately result in catastrophic failure of the entire PCB-based device. Such a failure is particularly problematic in certain technical fields, such as various military, aerospace, automotive, and medical device applications. PTH fatigue is influenced by various parameters, such as: the maximum and minimum temperatures; the PTH diameter; the copper plating thickness and material properties (e.g., ductility, yield strength); the substrate thickness and material properties (e.g., CTE, elastic modulus); and defects in the copper plating (e.g., voids, folds, etch pits). Reference is made to FIG. 1, which is a cross-sectional schematic illustration of a plated-through hole via with via cracks, as known in the art.

Numerous publications and industry joint efforts cover the key parameters that affect thermal cycle reliability. The strain accumulation depends on strain level induced at each thermal cycle excursion. There are several known approaches for increasing the useful PCB life cycle (i.e., number of thermal cycles before failure). One approach is to decrease the PTH aspect ratio, defined as the ratio between the board thickness and the PTH diameter, for example to less than about 5:1. The smaller the aspect ratio, the more consistent the plating throughout the length of the via. Large aspect ratio vias tend to have greater plating thickness at each end as compared to the center of the barrel, which increases the likelihood of cracked via barrels due to z-axis expansion when soldering. However, decreasing the PTH aspect ratio is extremely difficult (if not impossible) in the current era of High Density Interconnect (HDI) PCB designs. Another approach is to increase the copper (Cu) plating thickness, thereby increasing the space for the via crack to propagate. However, the thickness should be optimized for the process to reduce stress risers due to defects (such as voids in the Cu plating). A standard copper plating thickness is approximately 25 µm, and increasing the thickness beyond around 35 µm is extremely difficult from a manufacturing standpoint.

A further approach would be to improve and test for the adhesion of the Cu foil and the laminate. This option may be theoretically possible, but remains unproven. Yet another approach would be to utilize a Cu material with higher ductility and lower strength, although such a material has not yet been identified commercially. Other options involve decreasing or eliminating thermal shocks during board processing (such as by preheating the board before hot-air leveling, wave soldering, rework, etc), or decreasing the range of thermal cycling, specifically avoiding exposure to temperatures above the glass-transition temperature ($T_g$) of the resin. These options are not feasible since the board processing requires several necessary thermal processes.

U.S. Pat. No. 8,427,828 to Kehret et al. describes a printed circuit board module that includes a thermal shunt that provides a path between at least some of the electronic components and the front surface of the enclosure. U.S. Pat. No. 8,477,498 to Porecca et al. describes a conduction-cooled apparatus that includes conduction flow paths between a circuit card and the enclosure system. U.S. Pat. No. 8,482,929 to Slaton et al. describes a system for circuit board heat transfer that is configured to transfer heat from the PCB to the chassis through a thermal interface material and a thermal via. U.S. Pat. No. 7,459,200 to McCall et al. describes a circuit board where the fiberglass fibers are disposed in a two-dimensional pattern. U.S. Pat. No. 7,973,244 to Lin et al. describes a printed circuit board that includes a base formed from a plurality of woven fibers, and signal traces laid on the base.

U.S. Pat. No. 6,447,886 to Mohamed et al., entitled "Base material for a printed circuit board formed from a three-dimensional woven fiber structure", discloses a printed circuit board constructed from a base material formed from a three-dimensional orthogonally woven fabric having a crimp-free fiber architecture in the x-y plane and an integrated multi-layer structure. The base material includes: a first system of straight first fibers extending along a first direction in a first plane, a second system of straight second fibers extending along a second direction in a second plane parallel to the first plane, and a third system of third fibers extending along a third direction through the first and second systems and binding the first and second fibers. The direction of the third fibers may be orthogonal to the respective directions of the first and second fibers. A filler material, such as resin, coats a portion of the first, second and third systems. The printed circuit board further includes one or more conducive layers attached to the surfaces of the base material.

U.S. Pat. No. 5,379,193 to Gall et al., entitled "Parallel processor structure and package", is directed to a parallel processor package having a plurality of microprocessors and memory modules mounted on printed circuit boards. The printed circuit boards are mounted on a plurality of circuitized flexible substrates or "flex strips", which connect the separate boards through a relatively rigid central laminate portion. The central laminate portion provides XY plane and Z-axis interconnection and communication (inter-processor, inter-memory, inter-processor/memory and processor to memory bussing). The planar circuitization, as data lines, address lines, and control lines, are on the individual printed circuit boards, which are connected through the circuitized flex, and communicate with other layers of flex through Z-axis circuitization (via and through holes) in the central laminate portion.

SUMMARY OF THE INVENTION

In accordance with one aspect of the present invention, there is thus provided a printed circuit board (PCB) with enhanced durability. The PCB includes a plurality of PCB layers. At least one PCB layer includes a base material formed from a three-dimensional (3D) woven fiberglass fabric impregnated with a resin. The 3D woven fiberglass fabric includes a first group of fibers arranged in a plurality of parallel layers, where each layer includes a plurality of fibers extending along at least a first (x-axis) direction and aligned in a first (x-y) plane, and where the parallel layers are arranged along a second (z-axis) direction that is orthogonal to the first (x-y) plane. The 3D woven fiberglass fabric further includes a second group of fibers extending along at least the second (z-axis) direction, the second group of fibers being interlaced with the first group of fibers. Each PCB layer further includes a layer of conductive material deposited onto a surface of the base material, and at least one conductive plated through hole (PTH) extending through the base material of multiple PCB layers. The coefficient of thermal expansion (CTE) of the base material along the second (z-axis) direction substantially matches the CTE of the conductive material along the first (x-axis) direction. The second group of fibers may be interlaced with the first group of fibers in a non-orthogonal weaving pattern, such as an angle interlock weaving pattern or a multilayer weaving pattern. The first group of fibers or the second group of fibers may have a solid geometry, a hollow geometry, a shell geometry, or a nodal geometry. The 3D woven fiberglass fabric may include E-glass fibers or FR-4 fiberglass.

In accordance with another aspect of the present invention, there is thus provided a method for fabricating a PCB with enhanced durability. The method includes the procedure of forming a base material for at least one PCB layer from a three-dimensional (3D) woven fiberglass fabric impregnated with a resin. The 3D woven fiberglass fabric includes a first group of fibers arranged in a plurality of parallel layers, where each layer includes a plurality of fibers extending along at least a first (x-axis) direction and aligned in a first (x-y) plane, and where the parallel layers are arranged along a second (z-axis) direction that is orthogonal to the first (x-y) plane. The 3D woven fiberglass fabric further includes a second group of fibers extending along at least the second (z-axis) direction, the second group of fibers being interlaced with the first group of fibers. The coefficient of thermal expansion (CTE) of the base material along the second (z-axis) direction substantially matches the CTE of the conductive material along the first (x-axis) direction. The method further includes the procedures of depositing a layer of conductive material onto a surface of the base material, and forming at least one conductive PTH extending through the base material of multiple PCB layers. The second group of fibers may be interlaced with the first group of fibers in a non-orthogonal weaving pattern, such as an angle interlock weaving pattern or a multilayer weaving pattern.

BRIEF DESCRIPTION OF THE DRAWINGS

The present invention will be understood and appreciated more fully from the following detailed description taken in conjunction with the drawings in which:

FIG. 7 is a chart depicting the simulation results of mean fatigue life for PCB materials with different parameters, using the IPC-TR-579 Failure Model, operative in accordance with an embodiment of the present invention.

DETAILED DESCRIPTION OF THE EMBODIMENTS

The present invention overcomes the disadvantages of the prior art by providing thermal management approaches for a printed circuit board (PCB) and/or printed circuit assembly (PCA). The terms "printed circuit board (PCB)" and "printed wiring board (PWB)" are considered analogous and are used interchangeably herein. Correspondingly, the terms "printed circuit assembly (PCA)" and "printed wiring assembly (PWA)" are considered analogous and are used interchangeably herein, where a PCA is used to refer to the PCB board together with the electronic components assembled on the board. A first thermal management approach involves an air flow through cooling mechanism with multiple airflow channels for reducing the heat load in a PCA, where the air flow direction through at least one of the channels is different from the air flow direction through at least another of the channels. Alternatively or additionally, the airflow inlet of at least one of the channels is off-axis with respect to the airflow outlet of the channel. A second thermal management approach involves a fabrication technique for a PCB involving a 3D woven fabric, which helps mitigate the phenomenon of via cracking or PTH fatigue and increase the mean time between failures (MTBF) of the PCB.

Figure 1:
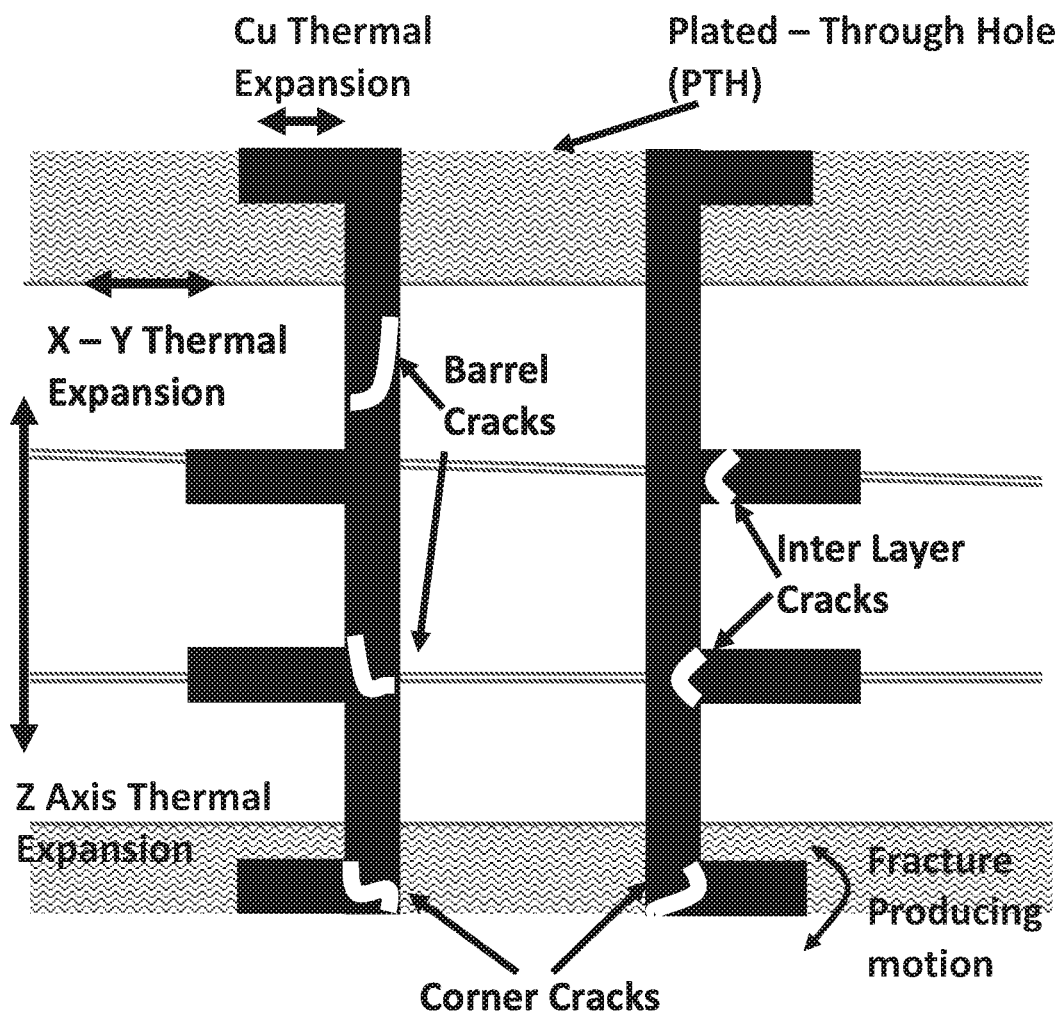
FIG. 1 is a cross-sectional schematic illustration of a plated-through hole via with via cracks, as known in the art.
Figure 2:
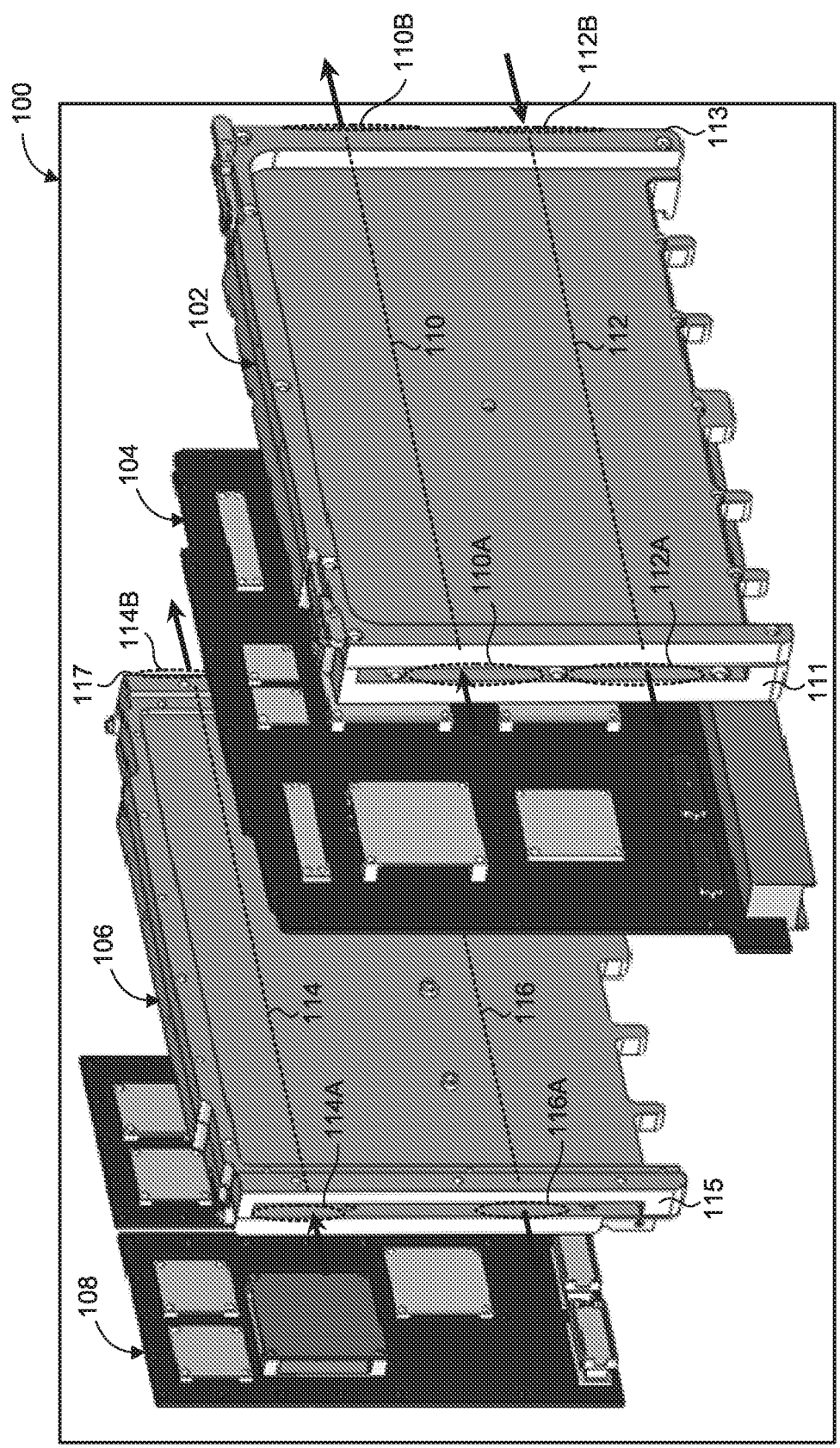
FIG. 2 is a perspective view illustration of a PCA that includes an air flow through (AFT) cooling mechanism with multiple air flow channels, constructed and operative in accordance with an embodiment of the present invention.

According to one embodiment of the present invention, the multiple airflow channels of an individual PCA board are configured to direct cooling air in different (e.g., opposite) directions. Reference is now made to FIG. 2, which is a perspective view illustration of a PCA, generally referenced 100, that includes an air flow through (AFT) cooling mechanism with multiple airflow channels, constructed and operative in accordance with an embodiment of the present invention. Printed Circuit assembly (PCA) 100 includes a host-frame 102, a host-board 104, a mezzanine-frame 106, and a mezzanine-board 108. A first surface (e.g., "top side") of host-board 104 is mounted or secured to one side of host-frame 102, while an opposite surface (e.g., "bottom side") of host-board 104 is mounted or secured to one side of mezzanine-frame 106. Mezzanine-board 108 is mounted or secured to an opposite side of mezzanine-frame 106. PCA 100 may be enclosed in a housing or chassis, and may include any number of frames and boards.

Host-frame 102 and mezzanine-frame 106 each include an interior cavity or a substantially hollow core. Host-frame 102 includes multiple airflow channels 110, 112. In particular, a first edge surface 111 of host-frame 102 includes an inlet 110A of airflow channel 110, and a second edge surface 113 of host-frame 102 includes an outlet 110B of airflow channel 110. An inlet 112A of airflow channel 112 is on the second edge surface 113 of host-frame 102, and an outlet 112B of airflow channel 112 is on the first edge surface 111 of host-frame 102. Each inlet 110A, 112A and outlet 110B, 112B is an opening defined as at least one aperture disposed on the respective edge surface (111, 113) of the host-frame 102. Accordingly, airflow channel 110 extends through the volume cavity within host-frame 102, between inlet 110A on one end and outlet 110B on the other end. Similarly, airflow channel 112 extends in the opposite direction through the volume cavity within host-frame 102 between inlet 112A and outlet 112B. Correspondingly, mezzanine-frame 106 includes airflow channels 114, 116. In particular, airflow channel 114 extends through the interior cavity of mezzanine-frame 106 between inlet 114A on a first edge surface 115 and outlet 114B on a second edge surface 117 of mezzanine-frame 106. Airflow channel 116 extends in the opposite direction through the interior cavity of mezzanine-frame 106 between inlet 116A on second edge surface 117 and outlet 116B on first edge surface 115.

Each air flow channel (110, 112, 114, 116) may include at least one element or mechanism configured to direct air flow along a selected direction along the respective airflow channels, such as internal fins. The fins (or other mechanism) may be configured in various ways, such as in accordance with the particular characteristics of the PCA and channel designs. It is noted that host-frame 102 and mezzanine-frame 106 may generally include any number of (multiple) airflow channels, while two respective channels are depicted here for exemplary purposes only. It is further noted that PCA 100 may include multiple mezzanine-boards and/or multiple mezzanine-frame, and further alternatively there may be multiple boards mounted or secured within a single frame. For example, two additional mezzanine-boards may be mounted onto opposite sides of host-board 104 and attached to host-frame 102 to cool (resulting in a total of four mezzanine-boards in the PCA).

Airflow channels 110, 112 serve to allow air to pass through, in order to dissipate heat generated by the electronic components of host-board 104 during its operation, particularly the electronic components disposed on the regions of host-board 104 that are adjacent to airflow channels 110, 112 within host-frame 102. In particular, air enters inlet 110A and flows through channel 110 along the length of host-frame 102 and exits from outlet 110B, thereby cooling the electronic components of host-board 102 situated near and along channel 110. Similarly, air enters inlet 112A and flows through channel 112 along the length of host-frame 102 and exits from outlet 112B (i.e., in an opposite direction with respect to the air flow through channel 110), thereby cooling the electronic components of host-board 102 situated near and along channel 112.

Correspondingly, the airflow channels 114, 116 of mezzanine-frame 106 serve to dissipate heat generated by the electronic components on mezzanine-board 108, as well as dissipating heat generated by the electronic components on the host-board 104 which are situated adjacent to airflow channels 114, 116 of mezzanine-frame 106. In particular, air enters respective inlets 114A, 116A and flows through respective channels 114, 116 along the length of mezzanine-frame 106 and exits from respective outlets 114B, 116B, thereby cooling the electronic components of host-board 102 and mezzanine-board 108 situated near and along channels 114, 116.

PCA 100 is characterized by multidirectional airflow cooling, since a first airflow channel outlet (110B) and a second airflow channel inlet (112B) are disposed on one edge surface (113) of host-frame 102, while the second airflow channel outlet (112A) and the first airflow channel inlet (110) are disposed on another edge surface (111) of host-frame 102. As a result, the cooling air flows along channel 110 from inlet 110A (edge surface 111) to outlet 110B (edge surface 113) in a first direction (i.e., from left to right as depicted in FIG. 2), while cooling air flows along channel 112 from inlet 112A (edge surface 113) to outlet 112B (edge surface 111) in an opposite direction (i.e., from right to left as depicted in FIG. 2). Such a multidirectional AFT channel configuration may provide a more uniform temperature distribution and a reduction in the overall PWA temperature, as compared to an AFT channel configuration with unidirectional airflow cooling.

Figure 3:
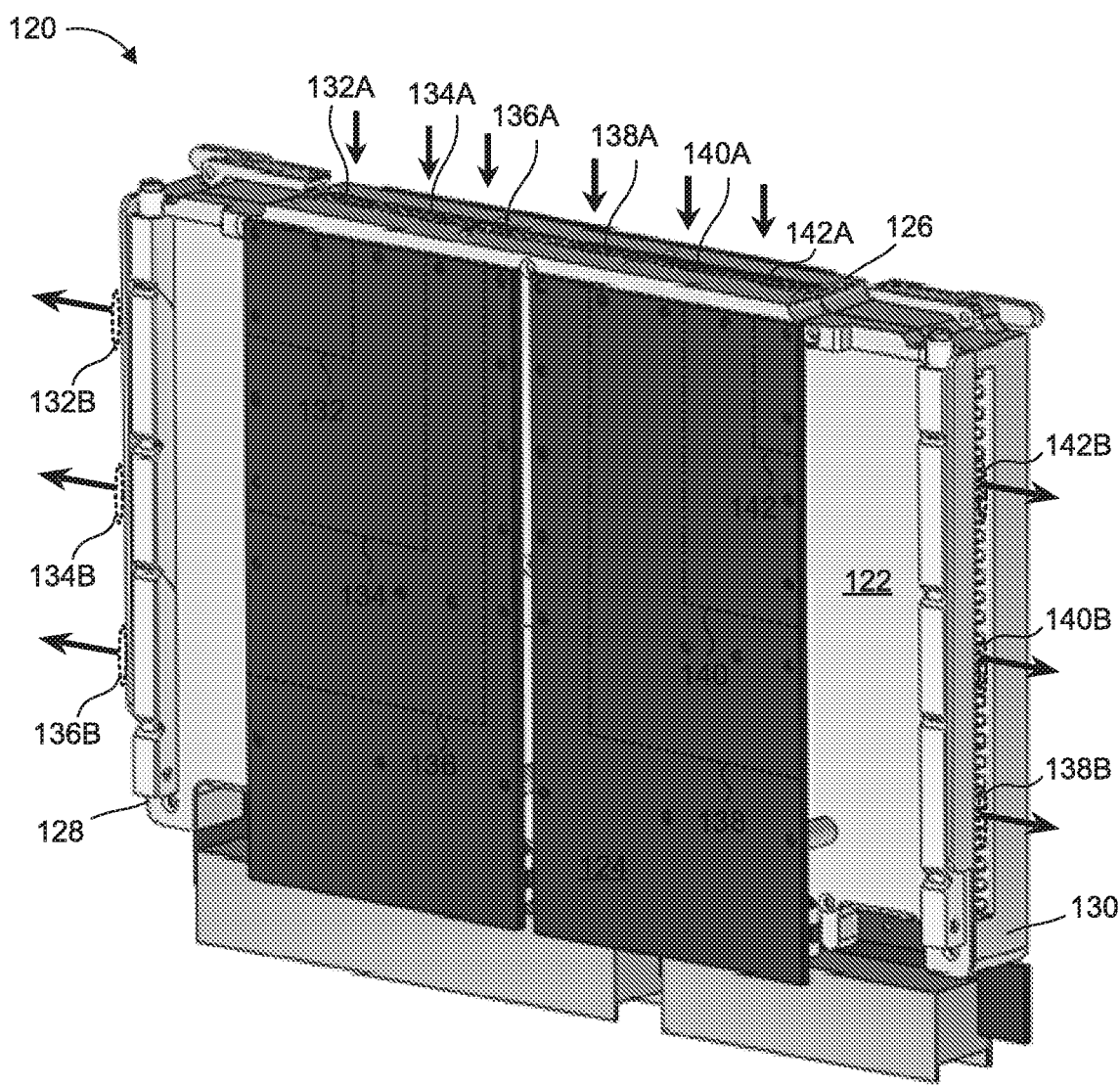
FIG. 3 is a perspective view illustration of a PCA that includes an air flow through cooling mechanism with multiple channels having perpendicular inlets and outlets, constructed and operative in accordance with another embodiment of the present invention.

According to another embodiment of the present invention, the airflow channel outlet may be configured in an off-axis alignment relative to the airflow channel inlet. Reference is now made to FIG. 3, which is a perspective view illustration of a PCA, generally referenced 120, that includes an air flow through cooling mechanism with multiple channels having perpendicular inlets and outlets, constructed and operative in accordance with another embodiment of the present invention. PCA 120 includes a host-frame 122 and a host-board 124. A surface of host-board 124 is mounted or secured to one side of host-frame 122. Host-frame 122 includes multiple airflow channels (132, 134, 136, 138, 140, 142) extending through an interior cavity of host-frame 122, where each airflow channel is aligned in an "L-shaped" configuration. In particular, a first edge surface 126 (e.g., "top side") of host-frame 122 includes respective inlets 132A, 134A, 136A, 138A, 140A, 142A of respective airflow channels 132, 134, 136, 138, 140, 142. A second edge surface 128 (e.g., "left side") of host-frame 122, which is substantially orthogonal to the first edge surface 126, includes respective outlets 132B, 134B, 136B of respective airflow channels 132, 134, 136. A third edge surface 130 (e.g., "right side") of host-frame 122, which is substantially orthogonal to the first edge surface 126, includes respective outlets 138B, 140B, 142B of respective airflow channels 138, 140, 142. Accordingly, air passing through an airflow channel 132, 134, 136, 138, 140, 142 changes direction, as it enters host-frame 122 from a respective inlet on edge surface 126 (i.e., from the top side) along a first axis, and then exits host-frame 122 from a respective outlet on edge surface 128 or 130 (i.e., from the left or right side) along a second axis that is different from the first axis, such that the air flows in an "L-shaped" pattern. As air passes through the airflow channels 132, 134, 136, 138, 140, 142 of host-frame 122, the heat generated by the electronic components of host-board 124 that are situated adjacent to the respective channels is dissipated. Each air flow channel (132, 134, 136, 138, 140, 142) may include at least one element or mechanism (such as internal fins) configured to direct the air flow along selected directions through the respective airflow channels. It is appreciated that the "off-axis inlet/outlet" airflow channel configuration of PCA 120 may provide additional flexibility with regard to the layout of the board components, as compared to the parallel airflow channel configuration of PCA 100 (FIG. 2). Whereas a single straight airflow channel (i.e., single axis air flow) would be characterized by one cooled area and one uncooled (hot) area, an off-axis inlet/outlet airflow channel configuration allows a designer to divide the board into two separate cooling areas and two separate uncooled areas, providing greater flexibility when designing the layout of the integrated circuits on the board. For example, two high power components may be positioned on each side of host-board 124 with the same cooling conditions. Moreover, the off-axis inlet/outlet channel configuration of PCA 120 may provide a more uniform temperature distribution, as well as a substantially lower pressure drop for the same flow rate.

At least one of the airflow channels of PCA 100, 120 may be characterized by a single inlet and multiple outlets, or alternatively, multiple inlets and a single outlet. For example, referring to FIG. 3, a single airflow channel may extend from inlet 132A through to outlets 132B and 134B on edge surface 128. For another example, a single airflow channel may extend from inlet 132A through to outlets 132B and 142B on opposite edge surfaces 128, 130, resulting in a "T-shaped" channel configuration.

It is appreciated that the multiple airflow channels of PCAs 100, 120 (FIGS. 2 and 3) provide greater airflow cooling, in comparison to that provided by an AFT cooling configuration with a single airflow channel. The enhanced airflow cooling reduces the temperature distribution on the PCA board, which also allows for increasing the amount and/or the operational power of the electronic components mounted on the PCA board. In addition, multiple airflow channels allows the thermal distribution on the board to be more uniform as a function of the airflow per each inlet and the power distribution, than would be the case with a single channel with a single inlet. Moreover, the PCA designer is provided with greater flexibility regarding the distribution of the electronic components on the board, particularly the high power components. It is also noted that the multiple airflow channels results in a reduction in pressure drop in each channel, in comparison to an AFT cooling configuration with a single channel. Furthermore, having multiple channels reduces the heat load concentration on each individual channel, and therefore reduces the heat flux concentration on the individual channel. Multiple channels also increase the heat transfer area of the air (or other fluid) flowing through the channel, and increases the number, size and/or operating power of board components that can be in contact with the channel.

According to a further embodiment of the present invention, at least one airflow channel may be selectively regulated by modifying a property or characteristic of the channel, such as by adjusting the aperture diameter of the channel inlet and/or the channel outlet, adjusting the channel volume, or by changing the airflow direction through the channel. For example, with reference to PCA 100 (FIG. 2), a controller (not shown) is configured to adjust the diameter of an inlet (110A, 112A) and/or an outlet (110B, 112B) of an airflow channel 110, 112, in accordance with real-time requirements. For example, if the electronic components on host-board 104 situated near or along airflow channel 112 are characterized with greater power loads and/or produce more heat as compared to the components situated near or along airflow channel 110, then the controller may reduce the aperture size of inlet 110A and/or outlet 110B, or alternatively or additionally, may increase the aperture size of inlet 112A and/or outlet 112B, such that greater airflow will occur through channel 112 than through channel 110. For example, the cooling air may be diverted entirely to airflow channel 112. In another example, the controller may change the airflow direction through an airflow channel, such as by directing cooling air to flow in an opposite direction in airflow channel 110 (i.e., from the previous outlet 110B through the previous inlet 110A), or by establishing off-axis airflow from a different inlet and/or a different outlet of channel 110. The direction of air flow through a channel may be modified when there is an increase or decrease in the heat load on a particular area of the host-board. The controller may be coupled to at least one sensor (not shown), and may determine how or whether to adjust the properties of an airflow channel 110, 112 based on real-time feedback related to PCA 100 as obtained by the sensor. For example, the sensor is configured to detect at least one parameter of host-board 104 and/or mezzanine-board 108, such as the temperature level or current load (using a thermal sensor or a current sensor). The controller obtains an indication of the relevant parameter(s) from the sensor (e.g., real-time thermal level or current load of different board components), and then selectively modifies the properties of at least one airflow channel 110, 112 (e.g., by reducing or increasing at least one inlet/outlet aperture diameter, or by changing a direction of air flow) in accordance with the detected parameter(s). In general, the properties of the airflow channels that extend through the host-frame or mezzanine-frame may be selectively adjusted based on the real-time cooling requirements of the PCA. For example, a PCA may include multiple boards associated with different applications that each have different heat loads, such that greater air flow is directed through the airflow channels situated adjacent to the boards with greater heat loads (and vice-versa). The airflow cooling may also be selectively controlled on the level of the entire PCA chassis or housing, such as by dispersing air differentially between different frame pairs or board pairs (e.g., via non-unidirectional airflows).

Figure 4:
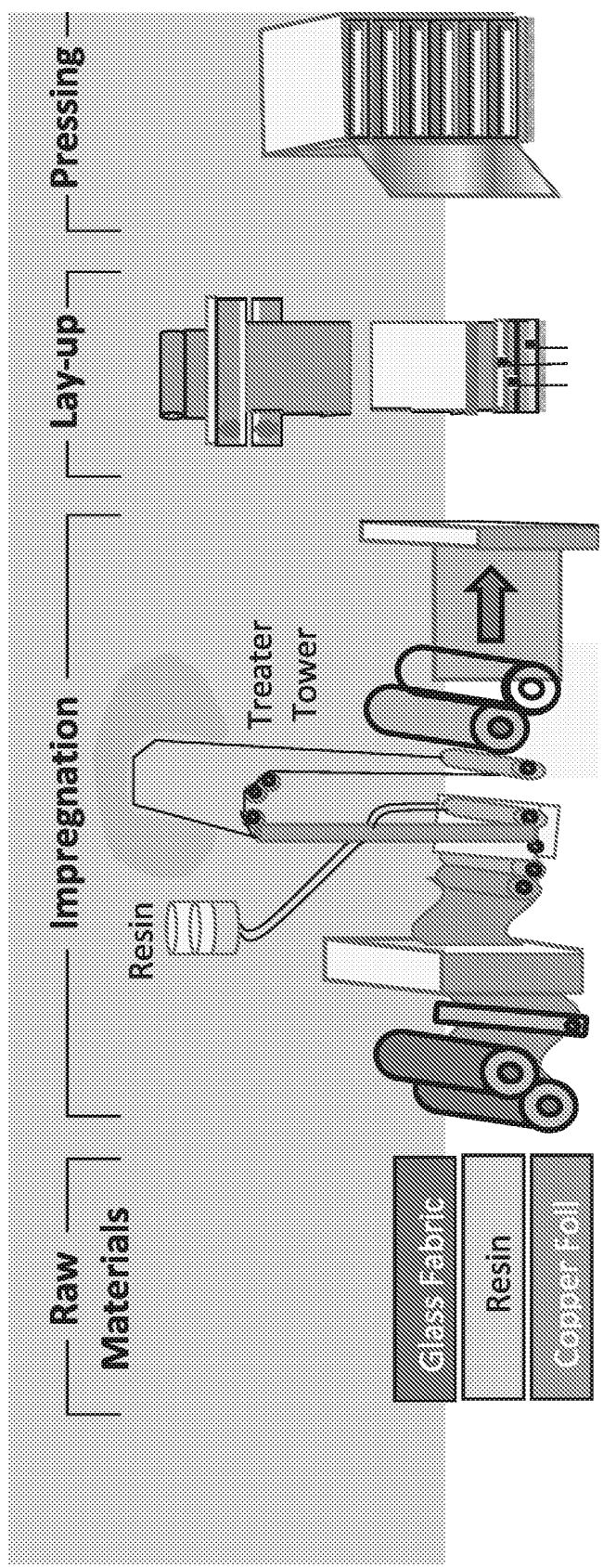
FIG. 4 is a schematic illustration of a PCB manufacturing process with a 3D woven fabric for the non-conductive substrate material, operative in accordance with an embodiment of the present invention.

In accordance with a second thermal management approach of the present invention, the nonconductive substrate or base material of the PCB is formed from a 3D woven fabric, such as 3D woven fiberglass impregnated with an epoxy resin, in order to mitigate the phenomenon of via cracking and PTH fatigue, thereby enhancing the PCB durability. Reference is now made to FIG. 4, which is a schematic illustration of a PCB manufacturing process with a 3D woven fabric for the nonconductive substrate material, operative in accordance with an embodiment of the present invention. The raw materials for the PCB manufacturing process include a glass fabric (e.g., fiberglass), an epoxy resin, and a copper foil, where the glass fabric is a 3D woven fabric, as discussed further hereinbelow. The 3D woven glass fabric is impregnated with the resin, following which the copper foil is laid up on and pressed together with the impregnated glass fabric. Subsequently, the pressed material is divided up into individual boards. It will be appreciated that manufacturing process shown in FIG. 4 is essentially a standard PCB manufacturing process, where a 3D woven glass fabric is used for the raw materials for the nonconductive substrate instead of a 2D glass fabric.

Figure 5A:
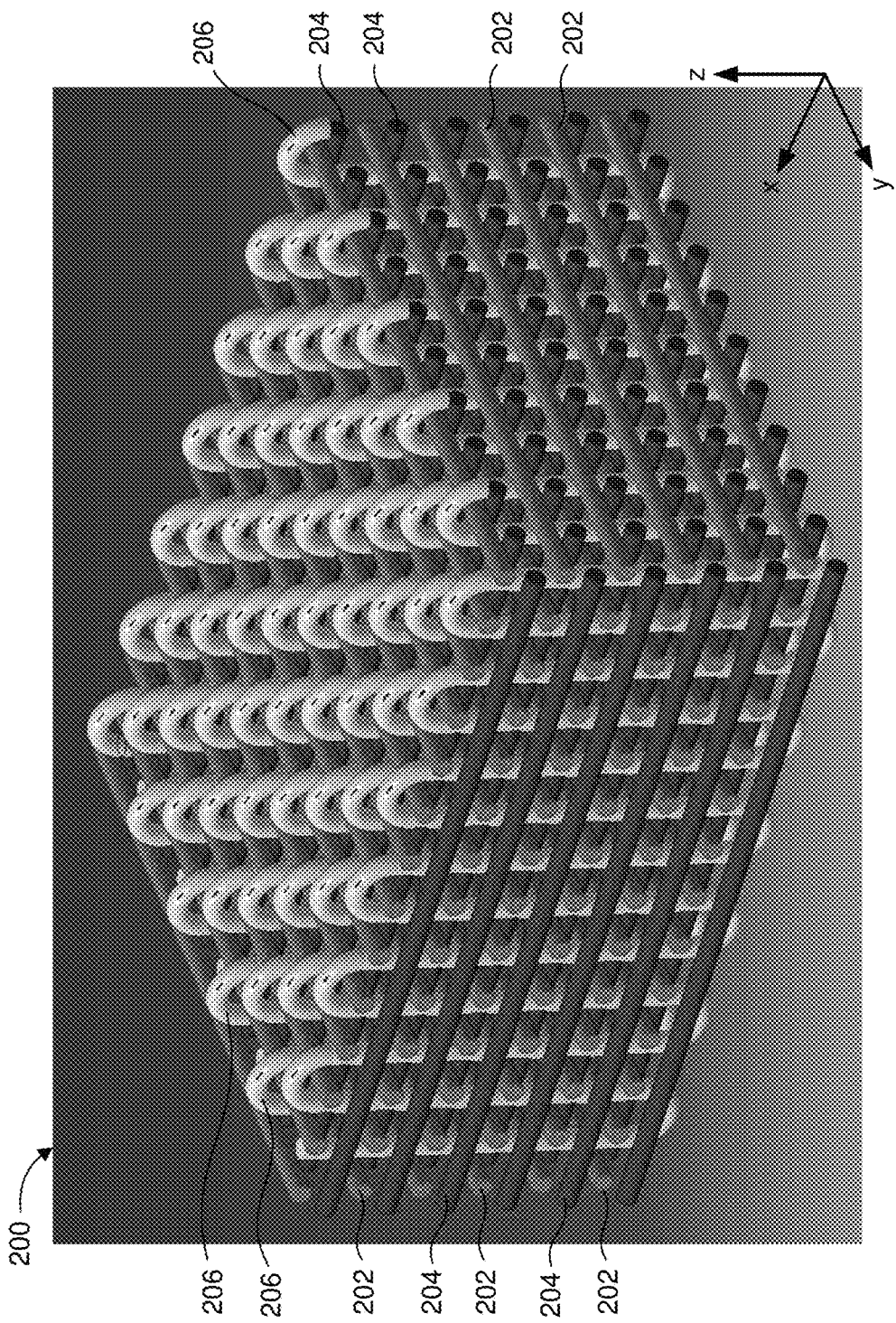
FIG. 5A is a perspective view illustration of an exemplary configuration of a segment of 3D woven fabric with an orthogonal weaving pattern, constructed and operative in accordance with an embodiment of the present invention.

Reference is now made to FIG. 5A, which is a perspective view illustration of an exemplary configuration of a segment of a 3D woven fabric with an orthogonal weaving pattern, generally referenced 200, constructed and operative in accordance with an embodiment of the present invention. 3D woven fabric 200 includes a first group of fibers, referenced 202 and 204, and a second group of fibers, referenced 206. First group of fibers 202, 204 are stacked in multiple layers. Each fiber 202 extends (lengthwise) along the x-axis direction, and rows of fibers 202 are arranged sequentially along the y-axis direction, such that each layer of fibers 202 is aligned (in sequential rows) in a common plane (the x-y plane). Similarly, each fiber 204 extends (lengthwise) along the y-axis direction, and rows of fibers 204 are arranged sequentially along the x-axis direction, such that each layer of fibers 204 is also aligned (in sequential rows) in the same x-y plane. Layers of fibers 202, 204 are arranged or stacked along an orthogonal direction (z-axis) that is orthogonal to the x-y plane, thus forming a matrix of fibers that extend along the x-axis and y-axis direction and arranged along the z-axis directions. Second group of fibers 206 are interlaced with the first group of fibers 202 and 204. Second group of fibers 206 are arranged in the z-axis direction, such that the length of each fiber 206 substantially passes through or extends along at least the z-axis (i.e., but may also traverse the x-axis or y-axis), while being interlaced through the first group of fibers 202, 204.

A 3D woven fabric may be classified according to various parameters, including: shedding mechanisms; weaving processes; weaving pattern/architecture; geometries/structures; and interlacements and fiber axis. One classification of 3D woven fabrics involves a conventional 2D weaving process designed to interlace two orthogonal sets of threads ("warp" and "weft"), which produces an interlaced 2D fabric on a 2D weaving device. Another classification uses a conventional 2D weaving process designed to interlace two orthogonal sets of threads (warp and weft) with an additional set of yarns functioning as binder warps or interlacer yarns in the through-the-thickness or z-axis direction. This is referred to as "multilayer weaving" and produces an interlaced 3D fabric constituting two sets of yarns on a 2D weaving device. A further classification uses a conventional 2D weaving process with three sets of yarns (ground warp, pile warp, pile weft) to produce pile fabrics, known as "2.5D fabrics". The fabric is manufactured by cutting a simple 3D weave consisting of two 2D fabrics connected by interwoven pile threads, to form a "hairy" fabric. These 2.5D fabrics are impregnated with epoxy resin in the standard manner, laminated and cured in an autoclave. Yet another classification involves a conventional 2D weaving process with three sets of yarns to produce a non-interlaced fabric with yarns in the warp, weft and through-the-thickness (z-axis) directions. Yet a further classification uses a 3D weaving process to interlace three orthogonal sets of yarns, to produce an "orthogonal weaving" pattern. The weaving shed operates both row-wise and column-wise. This produces a fully interlaced 3D fabric where all three sets of orthogonal yarns interlace, using a specifically designed 3D weaving machine. A final classification involves a non-woven, non-interlaced 3D fabric forming process designed to connect three orthogonal sets of yarns together with no interlacing (weaving), interloping (knitting), or intertwining (braiding). This fabric is held together by a special binding process.

Figure 5B:
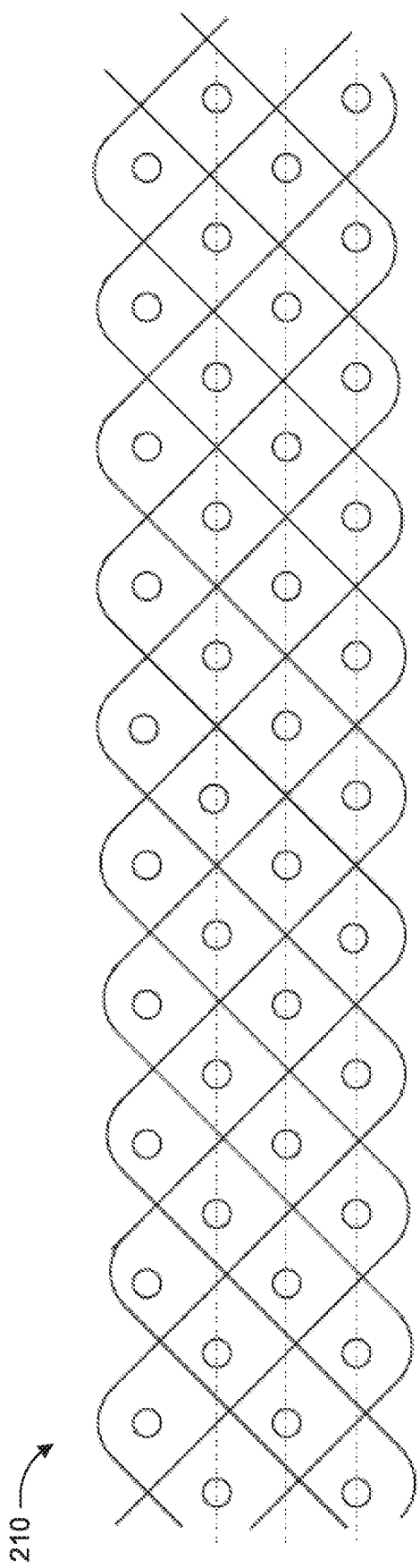
FIG. 5B is a cross-sectional illustration of a 3D woven fabric with an angle-interlock weaving pattern, constructed and operative in accordance with another embodiment of the present invention.
Figure 5C:
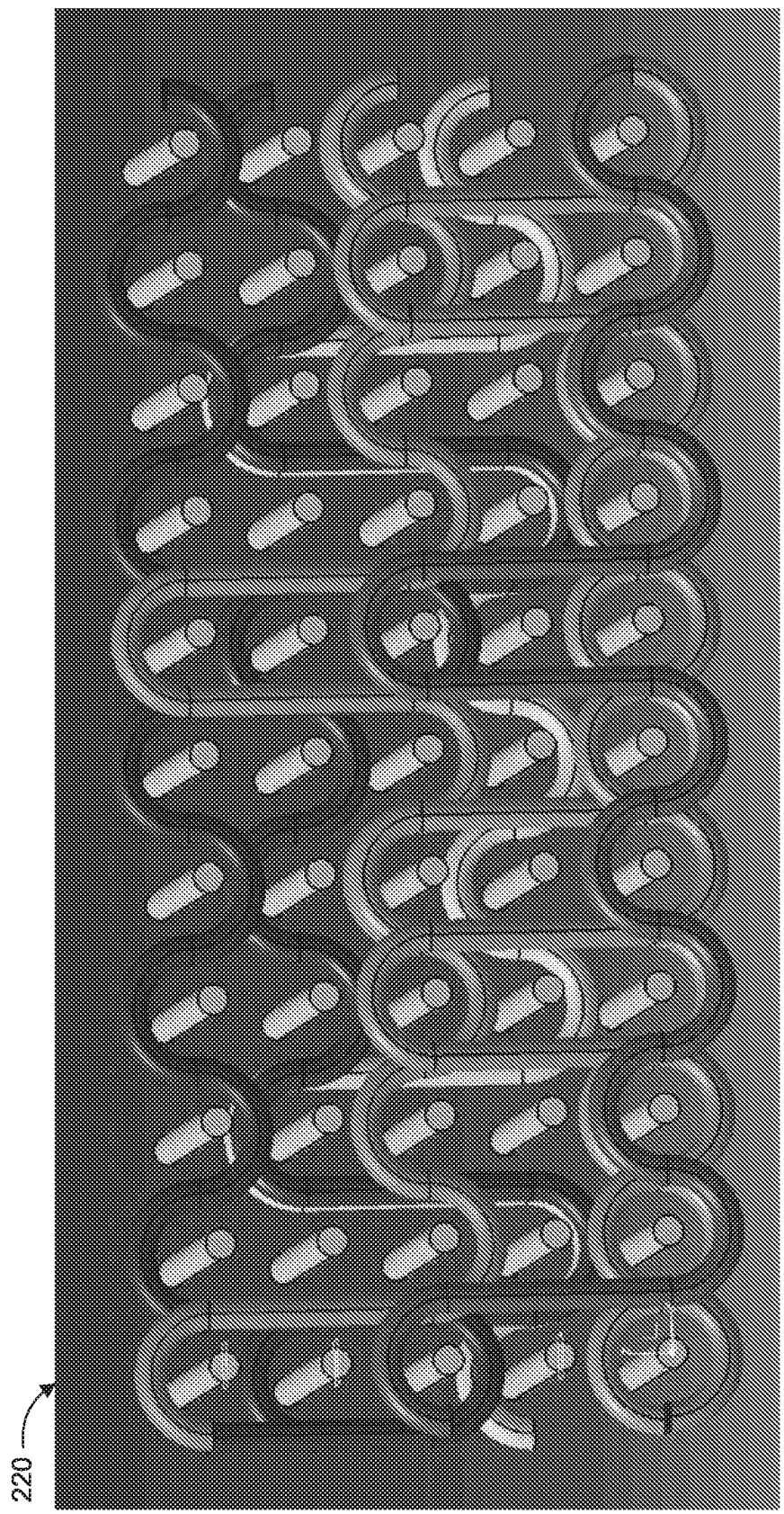
FIG. 5C is a perspective view illustration of a 3D woven fabric with a multilayer weaving pattern, constructed and operative in accordance with a further embodiment of the present invention.

In accordance with an embodiment of the present invention, the 3D woven fabric is characterized by an angular (i.e., non-orthogonal) weaving pattern or architecture, such as the multilayer and angle interlock weaving patterns shown in FIGS. 5B and 5C. FIG. 5B, is a cross-sectional illustration of a 3D woven fabric with an angle-interlock weaving pattern, generally referenced 210, constructed and operative in accordance with another embodiment of the present invention. FIG. 5C is a perspective view illustration of a 3D woven fabric with a multilayer weaving pattern, generally referenced 220, constructed and operative in accordance with a further embodiment of the present invention. Orthogonal weaving pattern 3D fabric 200 is characterized by straight yarns in all three principal directions, and is therefore useful for textiles where non-crimping is desired. Angle-interlock weaving pattern 3D fabric 210 is a 3D solid configuration in which the weft yarns are kept straight while the warp yarns are directed to pass through the fabric architecture diagonally with defined depth. Wadding yarns can be added in the warp direction to achieve high tensile modulus and strength. Multilayer weaving pattern 3D fabric 220 results in a fabric composed of two or more layers. Each layer may have its own weave, and the layers can be stitched to form an integral 3D architecture. The multilayer weaving process is designed to interlace two sets of yarns (warp and weft) with an additional set of yarns functioning as binder warps or interlacer yarns in the through-the-thickness or z-direction. It is noted that the angle interlock weaving pattern 210 and multilayer weaving pattern 220 can be produced with conventional 2D weaving machines, especially shuttle looms, whereas the orthogonal weaving pattern 200 requires a specially designed 3D weaving machine.

The fiber geometry (or "structure") of a 3D woven fabric can be selected from a variety of known geometric forms, such as: solid, hollow, shell and nodal. A solid geometry has a compound structure, with a regular or tapered geometric shape. A solid geometry is typically used with multilayer and angle interlock architectures. A hollow geometry provides a shape with both even surfaces and uneven surfaces, and multi-directional tunnels on different levels. A hollow geometry is typically used with a multilayer architecture. A 3D-hollow structure has openings in the fabric cross-section, and so a multilayer weaving pattern can be applied to both hollow structures with flat surfaces and to hollow structures with wavy surfaces. A shell geometry has a shape with spherical shells and/or open box shells. A shell geometry is typically used with a multilayer or single layer architecture. A nodal geometry has a shape with tubular nodes and/or solid nodes. A nodal geometry is typically used with multilayer and angle interlock architectures.

Figure 6A:
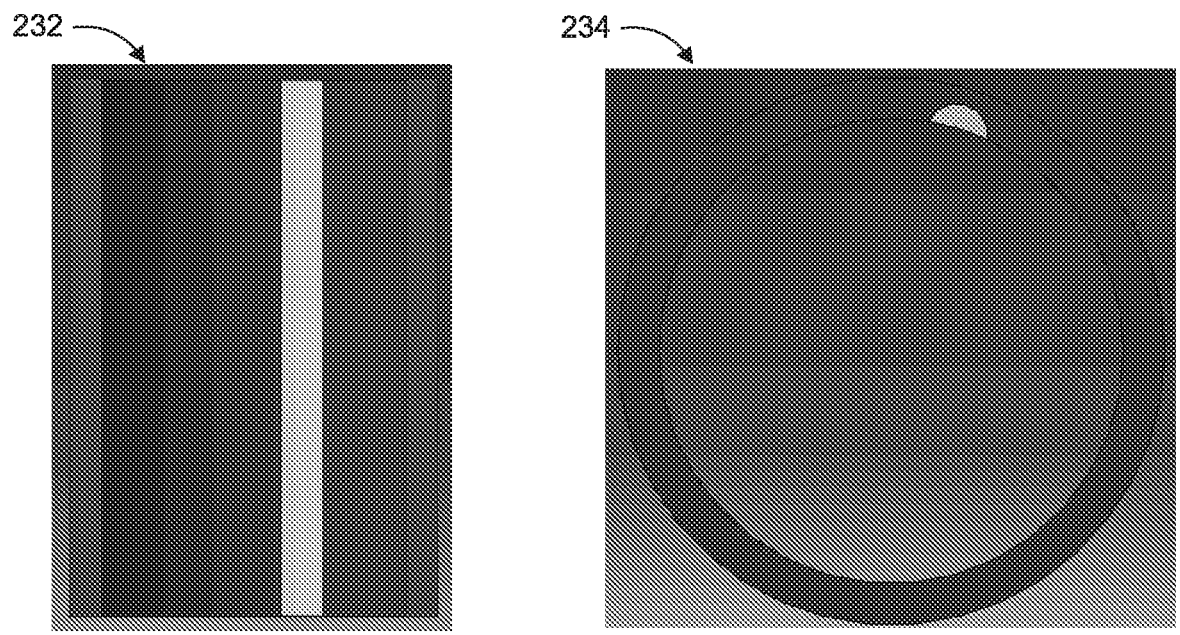
FIG. 6A is an exploded longitudinal view illustration, and an exploded cross-sectional view illustration of an orthogonal weave pattern fiber exhibiting drill smear, operative in accordance with an embodiment of the present invention.
Figure 6B:
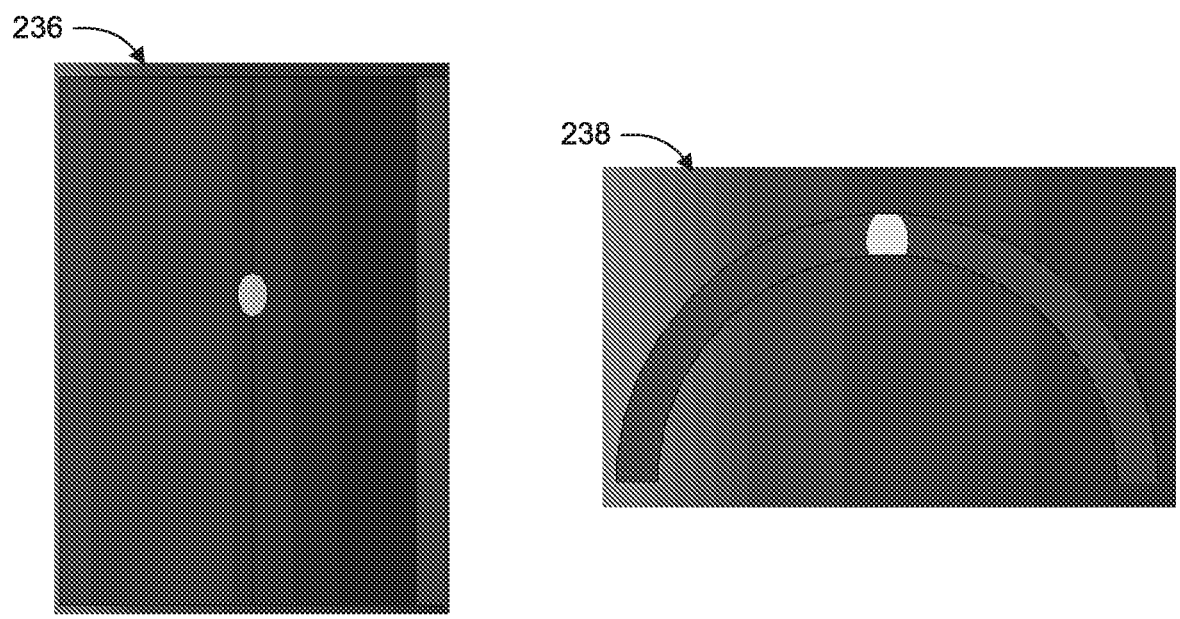
FIG. 6B is an exploded longitudinal view illustration, and an exploded cross-sectional view illustration of an angular weave pattern fiber without drill smear, operative in accordance with another embodiment of the present invention.

It should be noted that in a PCB formed from a 3D woven fabric with a non-orthogonal weaving pattern (such as angle-interlock or multilayer) and a solid fiber geometry, the phenomenon of "drill smear" when drilling the PTH via is substantially minimized, as compared to a PCB composed of a 3D woven fabric with an orthogonal weaving pattern. Drill smear relates to the formation of specks and debris caused during the drilling process, which are difficult to remove and may cover the conductors in the inner layers and impair the PCB conductivity. Reference is made to FIGS. 6A and 6B. FIG. 6A is an exploded longitudinal view illustration, referenced 232, and an exploded cross-sectional view illustration, referenced 234, of an orthogonal weave pattern fiber exhibiting drill smear, operative in accordance with an embodiment of the disclosed technique. FIG. 6B is an exploded longitudinal view illustration, referenced 236, and an exploded cross-sectional view illustration, referenced 238, of an angular weave pattern fiber without drill smear, operative in accordance with another embodiment of the disclosed technique. An orthogonal weave pattern results in drill smear (as seen in illustrations 232 and 234), since the cross cut section of any single fiber is a rectangle along the hole barrel of the PTH 242, and therefore continuity of the copper plating 244, is detrimentally impacted. In contrast, there is substantially no drill smear when implementing an angle weave pattern (as seen in illustrations 236 and 238), since the cross cut section of any single fiber is a semi-elliptical shape along the PTH 246. Thus, the continuity of the copper plating 248 in a 3D woven fabric with an angular (non-orthogonal) weave pattern is virtually similar to that of a 2D fabric, in which the corresponding area is essentially angular.

The properties of the z-axis fibers 206, such as the type of weaving pattern and the angle at which the (z-axis) fibers 206 are interlaced through the (x-y plane) fibers 202, 204, may be selected in accordance with the particular parameters and/or requirements of the PCB. For example, the z-axis interlacing angle is substantially acute, such as slightly less than 90 degrees (e.g., between 75-89 degrees), in order to avoid defects in the drilled hole and defects in the PTH copper plating (e.g., non-uniformity, dimpling, blistering, etc) that may result when drilling along a singular fiber or cluster. In general, exemplary parameters used for determining the properties of the z-axis fibers 206 include: the number of layers; the fabric density; the aspect ratio; the type of resin; and/or other relevant drilling parameters for producing a defect free hole after the copper plating.

Referring back to FIGS. 4, 5A, 5B and 5C, a layer of conductive material is deposited or disposed onto at least one surface of the non-conductive substrate of a PCB, such that one or more conductive PTH vias extend through the substrate to connect different layers of the PCB. 3D woven fabric (200, 210, 220) includes fibers 206 that are arranged in the through-the-thickness (z-axis) direction. As a result, the coefficient of thermal expansion along the z-axis direction (z-CTE) of a PCB substrate composed of a 3D woven fabric (200, 210, 220) substantially matches the z-CTE of the PCB via copper plating (e.g., approximately 17 ppm), thereby decreasing the thermal expansion of the PCB substrate over thermal cycling. In this manner, the phenomenon of via cracking (PTH fatigue) is substantially alleviated, and the ratio of thermal cycles to failure, or the "mean time between failures (MTBF")", is substantially increased (i.e., in comparison to a standard PCB with a substrate manufactured from a 2D woven fabric). Essentially, a standard PCB having a substrate composed of 2D woven fabric is anisotropic (i.e., the material properties depend on the direction), at least with respect to the CTE properties (i.e., the z-CTE is substantially different than the x-CTE and y-CTE). In contrast, a PCB with a 3D woven fabric based substrate is isotropic (i.e., the material properties are identical in all direction) in terms of the CTE, or perhaps "quasi-isotropic" in the case of the angular or non-orthogonal 3D fabric weaving patterns, such that the z-CTE substantially matches the x-CTE and y-CTE of the material. For comparison purposes, a typical x-CTE and y-CTE for commercially available 2D woven fabric is approximately 17 ppm below the glass transition temperature (Tg), while a typical z-CTE is approximately 50 ppm below Tg. The term "isotropic" is used herein in a sufficiently broad manner to encompass scenarios in which material properties are "substantially similar" in all directions (but not necessarily "identical"), for example encompassing the "quasi-isotropic" configuration of angular weaving patterns 210, 220.

In addition, if the 3D woven fabric is characterized with a non-orthogonal weaving pattern (such as patterns 210, 220), the z-axis fibers 206 of the 3D woven fabric (210, 220) are positioned at different (non-uniform) angles. Accordingly, the PCB substrate fabricated with the non-orthogonal pattern 3D woven fabric (210, 220) is characterized by reduced non-uniformity at the interface between the conductive surface and the nonconductive substrate when the PTHs are drilled, which further serves to substantially minimize defects in the drilled hole and defects in the PTH copper plating, such as non-uniformity, dimpling, blistering, drill smear, and the like.

3D woven fabric 200, 210, 220 may be fiberglass, such as E-glass fibers or FR-4 fiberglass. The conductive material of the PCB may be, for example, copper (Cu), such that the PTH that extends through the PCB substrate is copper-plated. The PCB may include any type of via with any configuration, including but not limited to: a stub via, a through via, a blind via, a buried via, and/or a back-drilled via. The thickness of the fibers may be between approximately 10-20 μm. 3D woven fabric 200, 210, 220 may optionally include a surface treatment, such as primer or plasma, in order to improve the flow of the resin and its final adhesion to the fabric surface during the impregnation step of the PCB manufacturing process (FIG. 4).

Reference is now made to FIG. 7, which is a chart, generally referenced 250, depicting the simulation results of mean fatigue life (MTF) for PCB materials with different parameters, using the IPC-TR-579 Failure Model, operative in accordance with an embodiment of the present invention. The mean fatigue life is defined as the number of thermal cycles before failure, where "failure" is defined as a percentage increase in resistance of the PCB above the initial resistance measurement at a given test temperature. The simulation calculations are based on parameters such as: the type and thickness of the PCB material, the PTH size, and the expected thermal environment. In chart 250, all simulations were based on a generic PCB material with a thickness of 3 mm and a PCB elastic modulus of 3447 MPa, but varying values of z-CTE (50 ppm/° C.; 33 ppm/° C.; 17 ppm/° C.). All simulations of chart 250 were based on a PTH diameter of 0.3 mm, and PTH wall thickness of 0.025 mm, but varying values of PTH quality factors (either "poor" or "good", as defined under the IPC-TR-579 Failure Model standard in relation to the workmanship of a shop or supplier). All simulations of chart 250 were based on a minimum temperature of −30° C. and a maximum temperature of 71° C. From the simulation results, it is evident that a PCB material with a z-CTE of 17 ppm/° C., such as a PCB composed from a 3D woven fabric in accordance with the present invention, results in a significantly larger "cycles to failure" value as compared to the other options. More particularly, the resultant cycles to failure value of a 3D fabric reinforced PCB is "virtually infinity", and thus the durability improvement of such a PCB can be considered as conceivably unlimited, with respect to other PCBs that are characterized by anisotropic CTE properties. It is further noted that whereas a "good quality" PCB improves the cycles to failure ratio by at least an order of magnitude for the two non-3D fabric based PCBs (i.e., the "standard" and "best" solutions), the cycles to failure of the 3D fabric reinforced PCB remains "virtually infinity" regardless of whether the PCB quality is "poor" or "good". Thus, even a poor quality material provides an essentially unlimited improvement in PCB durability and mean fatigue life for a 3D woven fabric based PCB.

It will be appreciated that a variety of methods for providing thermal management for a PCB and/or PCA result from the above description. One such method for providing thermal management is a method for cooling a PCA that includes a host-frame and at least one host-board mounted to the host-frame. The method includes the procedure of dissipating heat generated by the host-board using a plurality of airflow channels extending through respective apertures defined through a volume cavity within the host-frame, where each of the channels includes at least one inlet at a first edge surface of the host-frame, and at least one outlet at a second edge surface of the host-frame. At least one of the airflow channels is configured to direct air flow in a first direction, and at least another one of the airflow channels is configured to direct air flow in a second direction that is different from the first direction. Alternatively or additionally, at least one of the airflow channels is configured with at least one inlet that is off-axis with respect to at least one outlet thereof.

Another such method for providing thermal management is a method for fabricating a PCB with enhanced durability. The method includes the procedure of forming a base material from a 3D woven fiberglass fabric impregnated with a resin. The 3D woven fiberglass fabric including a first group of fibers arranged in a plurality of parallel layers, where each layer includes a plurality of fibers extending along at least a first (x-axis) direction and aligned in a first (x-y) plane, and where the parallel layers are arranged along a second (z-axis) direction that is orthogonal to the first (x-y) plane. The 3D woven fiberglass fabric further includes a second group of fibers extending along at least the second (z-axis) direction, the second group of fibers being interlaced with the first group of fibers, such as in a non-orthogonal weaving pattern. The CTE of the base material along the second (z-axis) direction substantially matches the CTE of the conductive material along the first (x-axis) direction. The method further includes the procedures of depositing a layer of conductive material onto a surface of the base material, and forming at least one conductive PTH extending through the base material of multiple PCB layers.

It will be appreciated that the different embodiments of the present invention are not mutually exclusive and can be combined in various combinations to form a single embodiment including one or more of the different aspects (e.g., multi-directional airflow channels, multiple airflow channels with off-axis inlets and outlets, and PCB substrate composed of a 3D woven fabric). For example, the respective boards 120, 122 of PCAs 100 or 120 (characterized by multi-directional airflow cooling channels and/or off-axis airflow channel inlets/outlets) can be fabricated with a 3D woven fabric as in PCBs 200, 210, 220. Furthermore, the present invention can be combined or used in conjunction with other types of known internal or external cooling sources or heat mitigation devices, such as fans or heat sinks.

While certain embodiments of the disclosed subject matter have been described, so as to enable one of skill in the art to practice the present invention, the preceding description is intended to be exemplary only. It should not be used to limit the scope of the disclosed subject matter, which should be determined by reference to the following claims.

The invention claimed is:

1. A printed circuit assembly (PCA) comprising: at least one host-board, comprising electronic components mounted thereon; and
 a host-frame, said host-board mounted to said host-frame, said host-frame comprising a plurality of airflow channels extending through respective enclosed conduits defined through a volume cavity within said host-frame, each of said airflow channels comprising at least one inlet at a first edge surface of said host-frame, and at least one outlet at a second edge surface of said host-frame, each of said airflow channels configured to pass through respective cooling-air through a respective enclosed conduit separated from other airflow channels, while isolating the electronic components from said cooling-air,
 wherein said airflow channels comprises:
 a first airflow channel configured to direct a first cooling air flow at a first temperature and in a first direction through a first enclosed conduit, and a second airflow channel configured to direct a second cooling air flow at a second temperature through a second enclosed conduit in a second direction different from said first direction, to selectively cool the electronic components adjacent to each of the respective enclosed conduits at respective temperatures according to respective cooling requirements,
 wherein the second enclosed conduit is not linked with the first enclosed conduit such that the second cooling-air does not interact with the first cooling-air.

2. The PCA of claim 1, wherein for at least one of said airflow channels, said outlet at said second edge surface is orthogonal to said inlet at said first edge surface.

3. The PCA of claim 1, comprising a first airflow channel comprising an inlet at said first edge surface of said host-frame and an outlet at said second edge surface of said host-frame, and further comprising a second airflow channel comprising an inlet at said second edge surface of said host-frame and an outlet at said first edge surface of said host-frame.

4. The PCA of claim 1, further comprising a controller, configured to selectively adjust at least one channel property of at least one of said airflow channels, in accordance with at least one detected parameter of said host-board.

5. The PCA of claim 4, wherein said channel property is selected from the list consisting of:
 an aperture diameter of the channel inlet or channel outlet;
 the volume cavity of the airflow channel; and
 at least one direction of air flow through said channel.

6. The PCA of claim 4, wherein said detected parameter is selected from the list consisting of:
 temperature level; and
 current load.

7. The PCA of claim 4, further comprising at least one sensor coupled with said controller, said sensor selected from the list consisting of:
 a thermal sensor; and
 a current sensor.

8. A method for cooling the PCA of claim 1, the method comprising:
 passing through respective cooling-air in each of the airflow channels through the respective enclosed conduit separated from other airflow channels, while isolating the electronic components from the cooling-air, to selectively cool the electronic components adjacent to each of the respective enclosed conduits at respective temperatures according to respective cooling requirements.

9. The method of claim 8, further comprising selectively adjusting at least one channel property of at least one of the airflow channels, in accordance with at least one detected parameter of the host-board.

10. The method of claim 8, wherein at least one airflow channel is configured with at least one inlet that is off-axis with respect to at least one outlet thereof.

11. The PCA of claim 1, wherein at least one airflow channel is configured with at least one inlet that is off-axis with respect to at least one outlet thereof.

* * * * *